United States Patent [19]

Barker

[11] Patent Number: 5,185,278
[45] Date of Patent: Feb. 9, 1993

[54] METHOD OF MAKING SELF-ALIGNED GATE PROVIDING IMPROVED BREAKDOWN VOLTAGE

[75] Inventor: Dean W. Barker, Phoenix, Ariz.
[73] Assignee: Motorola, Inc., Schaumburg, Ill.
[21] Appl. No.: 601,087
[22] Filed: Oct. 22, 1990
[51] Int. Cl.⁵ ................. H01L 21/265; H01L 21/465
[52] U.S. Cl. ...................................... 437/39; 437/41; 437/228; 437/80; 437/912; 437/944
[58] Field of Search ............... 437/41, 228, 31, 43; 352/16; 148/DIG. 100; 156/650, 653

[56] References Cited

U.S. PATENT DOCUMENTS

| | | | |
|---|---|---|---|
| 4,525,919 | 7/1985 | Fabrian | 437/184 |
| 4,532,002 | 7/1985 | White | 156/652 |
| 4,661,204 | 4/1987 | Mathur et al. | 437/189 |
| 4,732,876 | 3/1988 | Buchmann et al. | 437/41 |
| 4,990,467 | 2/1991 | Lee et al. | 437/192 |
| 4,997,778 | 3/1991 | Sin et al. | 148/DIG. 100 |
| 5,006,478 | 4/1991 | Kobayaski et al. | 148/DIG. 100 |
| 5,053,348 | 10/1991 | Mishra et al. | 148/DIG. 100 |
| 5,066,383 | 11/1991 | Yamaguchi et al. | 204/435 |
| 5,112,763 | 5/1992 | Taylor et al. | 437/41 |

FOREIGN PATENT DOCUMENTS

| | | | |
|---|---|---|---|
| 0252888 | 1/1988 | European Pat. Off. | 437/41 |
| 63-34971 | 2/1988 | Japan . | |
| 1-03888 | 4/1989 | Japan | 437/41 |

OTHER PUBLICATIONS

Acosta etal. "High Temperature Polyomide-Based Left Off Process" IBM Technical Disclosure Bulletin, vol. 24, No. 7B, Dec. 1984, pp. 4432-4433.
Wolf et al. "Silicon Processing for the VLSI Era", vol. 1, Processing Technology, Library of Congress Cataloging in publication data, 1986, California, pp. 534-537.
Sze "VLSI Technology", second edition, McGraw Hill, New York 1988, p. 174.

Primary Examiner—Olik Chaudhuri
Assistant Examiner—Loc Q. Trinh
Attorney, Agent, or Firm—Joe E. Barbee

[57] ABSTRACT

A three level mask structure is formed on a wafer. The top layer of the mask structure has an opening that defines an etch area. The middle layer of the mask structure is etched through the opening in the top layer. This opening in the middle layer defines a gate deposition area. The layer adjacent to the wafer is etched, using the opening in the middle mask layer to define the etch area, until the etching undercuts the middle layer by a predetermined amount. The opening in the layer adjacent to the wafer is used to define an etch area on the wafer. The wafer is etched to form source and drain areas. Gate material is deposited onto the wafer using the opening in the middle layer to determine the deposition area. The mask structure is then removed.

16 Claims, 2 Drawing Sheets

METHOD OF MAKING SELF-ALIGNED GATE PROVIDING IMPROVED BREAKDOWN VOLTAGE

BACKGROUND OF THE INVENTION

The present invention relates, in general, to methods for implementing self-aligned transistors, and more particularly, to a method for implementing a MESFET having a self-aligned gate and accurately controlled gate to drain spacing.

Gallium Arsenide (GaAs) metal semiconductor field effect transistors (MESFETs) have been used in many applications by the industry. Previous methods for implementing these GaAs MESFETs resulted in transistors with lower breakdown voltages than the desired breakdown voltage for some applications, including the power output stage of radio frequency equipment. These previous MESFET implementations formed the source and drain areas using one mask procedure, and a separate mask procedure for actually forming the gate electrode. Using different mask steps to form the gate electrode, and the source and drain areas often produced transistors that had a misalignment between the gate and the source and drain areas. The misalignment created variations in the gate to drain spacing between transistors which resulted in breakdown voltage variations between transistors. One method to overcome the effect of the variations was to have a large gate to drain spacing so that the misalignment had a smaller effect on the overall gate to drain spacing. The increased gate to drain spacing increased the drain resistance which adversely affected the performance of the MESFET. The increased spacing also increased the die area required to implement the MESFET thereby increasing its manufacturing cost.

Accordingly, it would be desirable to have a method for implementing the gate electrode of a transistor that provides accurate control of the gate to drain spacing and results in transistors having high breakdown voltage, low drain resistance, and low cost.

SUMMARY OF THE INVENTION

The objects and advantages of the present invention are achieved by creating a three level mask structure on a wafer. The top layer of the mask structure has an opening that defines an etch area. The middle layer of the mask structure is etched through the opening in the top layer. This opening in the middle layer defines a gate deposition area. The layer adjacent to the wafer is etched, using the opening in the middle mask layer to define the etch area, until the etching undercuts the middle layer by a predetermined amount. The opening in the layer adjacent to the wafer is used to define an etch area on the wafer. The wafer is etched to form source and drain areas. Gate material is deposited onto the wafer using the opening in the middle layer to determine the deposition area. The three level mask is used to form the source and drain areas and also to form the gate electrode, therefore, the gate is properly aligned to the source and drain. The mask structure is then removed.

DETAILED DESCRIPTION OF THE DRAWINGS

The present invention provides a method for obtaining a transistor having a high breakdown voltage and a gate electrode that is self-aligned to the source and drain of the transistor. The method of the present invention includes using a single mask having three layers. The three layers are etched to form a mask structure that is used to create source and drain areas on the transistor and to create a gate electrode that is self-aligned to the drain. The method provides very accurate control of the gate to drain spacing in addition to providing a gate electrode that is self-aligned to the drain. Since the breakdown voltage is controlled by the distance between the gate electrode and drain, the present invention provides accurate control of the breakdown voltage.

While the invention is described with specific preferred embodiments, it is evident that many alternatives and variations will be apparent to those skilled in the semiconductor art. More specifically the invention has been described for a particular GaAs MESFET transistor structure, although the method is directly applicable to other MESFETs, as well as to other transistor structures.

Figure 1:
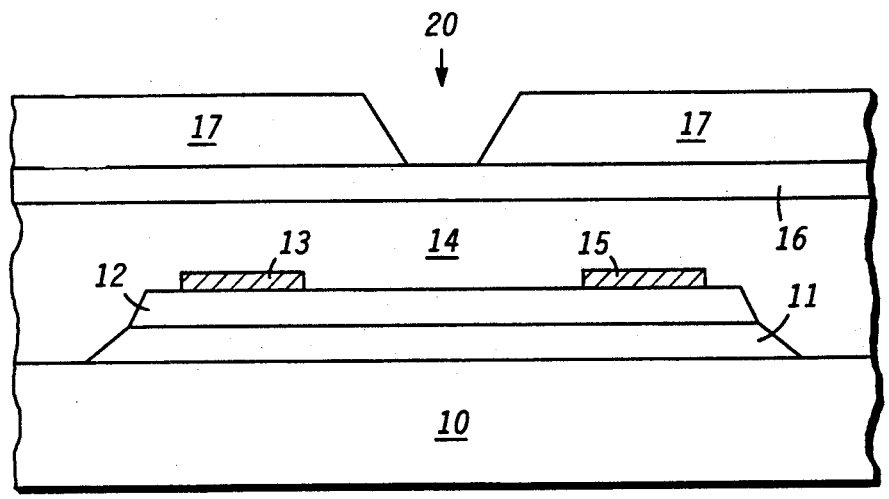
FIG. 1 is an enlarged cross sectional view of a portion of a MESFET wafer in a stage of manufacturing after the application of a three layer mask onto the wafer in accordance with the present invention.

Referring to FIG. 1, the present invention begins with a semiconductor substrate 10 having active layer 11, contact layer 12, source electrode 13, and drain electrode 15 formed as a mesa on substrate 10. Generally, there are many such mesas on the surface of substrate 10. In the preferred embodiment, substrate 10, active layer 11, and contact layer 12 are III-v semiconductor compounds that are used to form a GaAs MESFET. A first layer 14 of a three layer mask is applied covering substrate 10 and covering the mesa formed by active layer 11, contact layer 12, electrode 13, and electrode 15. First layer 14 of the three layer mask is a material that can cover the irregular surface of substrate 10 and provide an essentially level surface on which second layer 16 can be applied. Second layer 16 of the three layer mask is applied to the essentially level surface of first layer 14. A layer of photoresist is applied to second layer 16 to form third layer 17 of the three layer mask. An opening 20 in third layer 17 is used to define an etch area on second layer 16. As will be shown later, first layer 14 will subsequently be etched while second layer 16 remains on the surface of first layer 14. Therefore, first layer 14 must have an etch rate greater than 10 times that of second layer 16 in order to prevent etching of second layer 16 during the etching of first layer 14. Additionally, a solvent will be used to remove the three layer mask structure from substrate 10. Therefore, first layer 14 must also be a material that withstands the high temperatures of semiconductor processing and can subsequently be removed by immersion in a solvent. In the preferred embodiment, first layer 14 is a layer of polyimide that is spun onto the wafer and cured to form a smooth surface. Also in this embodiment, second layer 16 is a layer of silicon nitride having a thickness sufficient to withstand etching of the polyimide used for first layer 14. Generally, a thickness of approximately 2000 angstroms is sufficient for second layer 16.

Figure 2:
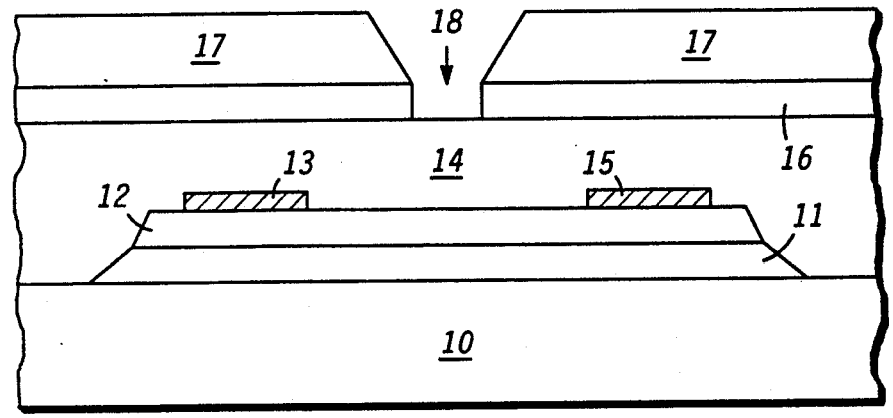
FIG. 2 is the wafer of FIG. 1 after etching an opening in one of the three layers of the mask in accordance with the present invention.

Referring to FIG. 2, opening 18 is created by etching second layer 16 through opening 20. Opening 18 will subsequently be used to define an area for depositing gate material to form a gate of a transistor. Therefore, the size of opening 18 defines the length of the gate. In the preferred embodiment, the silicon nitride used for second layer 16 is reactively ion etched in a fluorocarbon/oxygen ($CF_4/O_2$) plasma that etches third layer 17 slowly compared to second layer 16.

Figure 3:
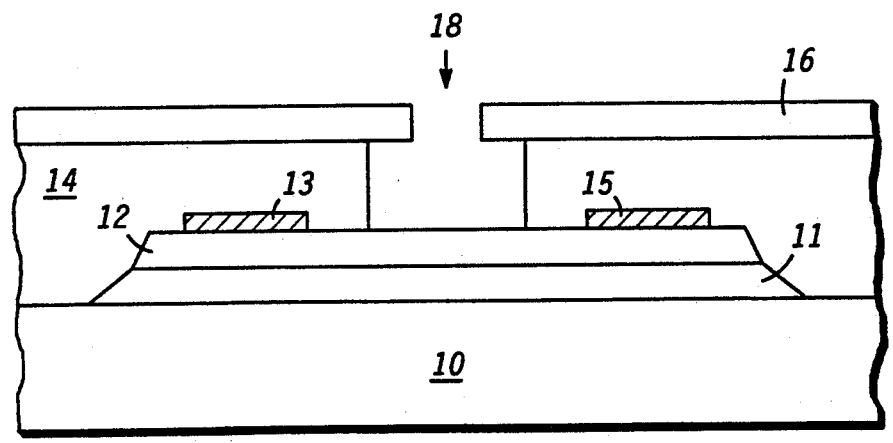
FIG. 3 is the wafer of FIG. 2 after etching an opening in another of the three layers of the mask in accordance with the present invention.

Referring to FIG. 3, first layer 14 is etched using opening 18 to define the etch area. Etching of first layer 14 continues until the opening in first layer 14 undercuts second layer 16 by a predetermined amount. Generally, photoresist layer 17 is completely etched away by this step. The structure created by this etching will be used as a mask for forming source and drain areas of the transistor.

In the preferred embodiment, an oxygen plasma reactive ion etch (RIE) is used to etch the polyimide used for first layer 14. The oxygen plasma etches the photoresist used for third layer 17 in addition to the polyimide, but does not etch contact layer 12 or the silicon nitride used for second layer 16. The polyimide used for first layer 14 is etched with a two stage procedure at a pressure of 400 millitorr. First a power of approximately 100 watts is used for approximately twenty-five minutes followed by a power of approximately 200 watts for approximately seven minutes. The low power etch produces a small undercut having vertical walls, while the higher power etching increases the undercut. The amount of the undercut is determined by the time, pressure, and power used to perform the etch. The desired distance of the undercut is determined by the breakdown voltage that is to be achieved. For the particular transistor used in the preferred embodiment, a desired breakdown voltage of approximately 20 to 25 volts is achieved with an undercut of approximately 0.8 to 0.9 microns.

Figure 4:
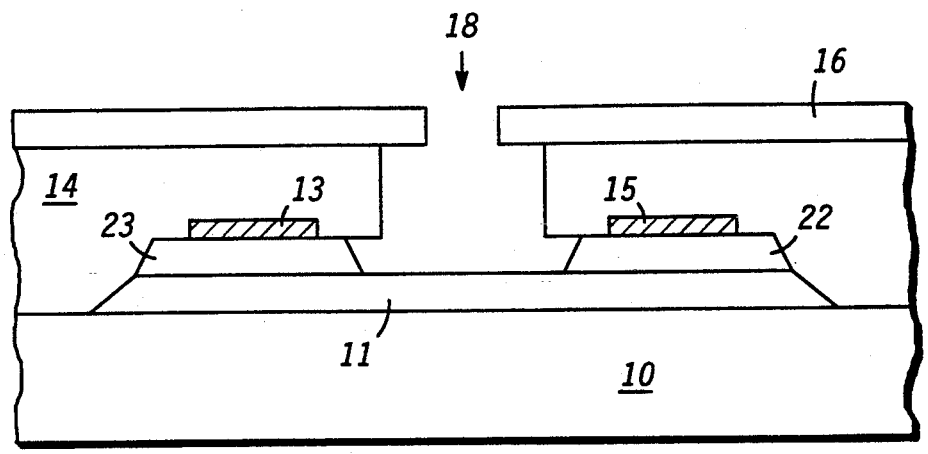
FIG. 4 is the wafer of FIG. 3 after etching an opening in the wafer in accordance with the present invention.

Referring to FIG. 4, contact layer 12 is etched, by using the mask structure formed by the opening in first layer 14, to form drain area 22 and source area 23. Therefore, the edge or boundary of the drain is defined by the edge of drain area 22. The etch procedure used for this step is determined by the material used to form contact layer 12. Generally, this will be a wet etch procedure that does not effect first layer 14 or second layer 16.

Figure 5:
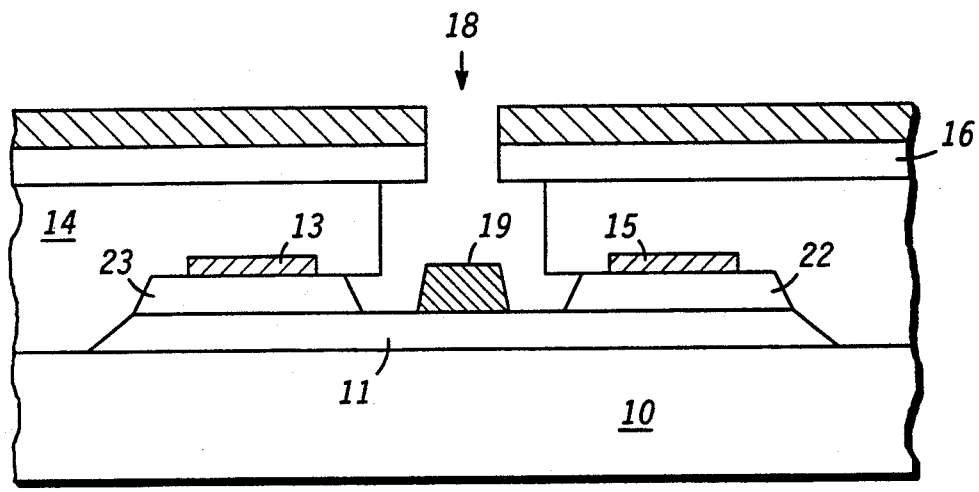
FIG. 5 is the wafer of FIG. 4 after depositing gate material in accordance with the present invention.

Referring to FIG. 5, gate material is deposited to form gate 19. A gate deposition area is defined by opening 18 in the mask structure. The gate material essentially forms on the exposed surface of active layer 11 in a direct line with opening 18, and also forms on the top of second layer 16. Therefore, opening 8 defines the length of the gate of the transistor while the amount first layer 14 undercuts second layer 16 determines the spacing between the gate and the drain of the transistor. This spacing is the distance between the edge of gate electrode 19 and the edge of drain area 22. Since the same mask structure is sued to form the source and drain in addition to the gate, the gate is self-aligned to the drain and to the source thereby minimizing variations in the spacing between the gate and the drain of the transistor. The distance between gate 19 and the transistor's drain is very accurately controlled by the undercut of first layer 14. Therefore, the transistor has very accurately controlled gate to drain spacing and gate to source spacing, a gate that is self-aligned to the drain and to the source, and a very accurately controlled breakdown voltage. Also, the drain resistance is minimized since the accurate control of the gate to drain spacing facilitates minimizing the gate to drain spacing for a particular breakdown voltage.

Figure 6:
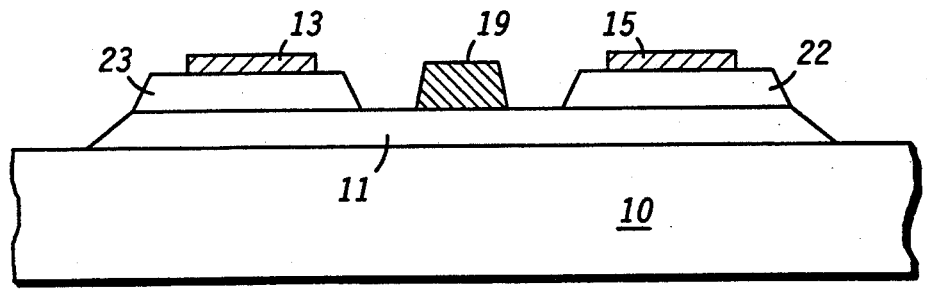
FIG. 6 is an enlarged cross sectional view of a portion of the MESFET wafer after removal of the three layer mask in accordance with the present invention.

Referring to FIG. 6, first layer 14 and second layer 16 are removed leaving gate electrode 19 separated from the drain and source of the transistor. In the preferred embodiment, the mask structure is removed with a lift-off technique by immersing the wafer in a solvent, methylene chloride or equivalent, to dissolve the polyimide used for first layer 14. In this embodiment, the three layer mask provides an unexpected benefit of higher yield for the liftoff procedure than the yield for a single level mask liftoff procedure. This liftoff procedure has a much higher occurrence of complete removal than liftoff using a single layer mask By now it should be appreciated that there has been provided a novel way to fabricate a gate that has accurately controlled gate to drain spacing and that is self aligned to the drain. The accurate spacing provides a minimal drain resistance for the desired breakdown voltage. This improves the performance of the transistor while lowering the manufacturing costs. Transistors with this improved performance and higher breakdown voltage can be used in many applications including high frequency oscillators, radio frequency equipment, power amplifiers, etc. The three layer mask procedure uses fewer mask steps to produce the gate than previous methods thereby further reducing costs. The added benefit of improved yield for the lift off procedure further reduces manufacturing costs.

I claim:

1. A method for forming MESFET transistors having high breakdown voltage which comprises:

providing a III-V compound substrate having a plurality of mesas used for implementing MESFETs with each mesa having an active layer in contact with the substrate, a contact layer covering the active layer, and a plurality of contacts on the contact layer for forming source and drain contacts;

covering the substrate and the mesas with a layer of polyimide;

covering the polyimide with a layer of silicon nitride;

covering the silicon nitride with a photoresist mask having openings centered between the source and drain contacts;

etching openings in the silicon nitride using the openings in the photoresist mask to define the etched openings in the silicon nitride;

etching in one step an opening through the polyimide wherein the etching undercuts the silicon nitride and forms walls substantially perpendicular to the silicon nitride and wherein the etching is performed through the openings in the silicon nitride and in the photoresist mask;

etching the contact layer which exposes a portion of the surface of the active layer wherein the etching is performed through the opening in the polyimide;

depositing gate material through the opening in the silicon nitride layer onto the surface of the active layer; and lifting off the polyimide, and the silicon nitride by immersing the substrate and structures on the substrate in a solvent.

2. The method of claim 1 wherein the etching openings in the silicon nitride includes etching with a reactive ion etch having an oxygen and fluorocarbon plasma.

3. The method of claim 1 wherein etching in one step the opening through the polyimide includes etching with a reactive ion etch having an oxygen plasma at a pressure of 400 millitorr and a reactor power of approximately 100 watts for approximately twenty-five minutes, then continuing the etch at a power of approximately 200 watts for approximately seven minutes.

4. The method of claim 1 wherein the etching the contact layer includes etching with a wet etch that leaves the silicon nitride and the polyimide intact.

5. The method of claim 1 wherein the lifting off the polyimide step includes immersing the substrate and structures on the substrate in methylene chloride or an equivalent solvent.

6. A method for forming MESFETs with self-aligned gates and high breakdown voltage which comprises;

providing a substrate having a plurality of mesas;

covering the substrate and the mesas with a three layer mask having openings through a first layer wherein the first layer is furthermost from the substrate and the openings ar displaced perpendicular to the mesas;

etching openings through a second layer, which is a middle layer, of the three layer mask by using the openings in the first layer to define the etched openings through the second layer;

etching openings through a third layer of the three layer mask, which is a layer of the three layer mask that contacts the substrate and the mesas and also forms a substantially planar third layer, by using the openings in the second layer to define the etch area wherein the etching undercuts the second layer and forms walls that are substantially perpendicular to the second layer;

etching into the mesas to define source and drain areas wherein the etching is performed through the three layer mask; and depositing gate material through the openings in the three layer mask.

7. The method of claim 6 wherein the covering the substrate step includes covering the substrate and the mesas with a layer of polyimide which forms the third layer of the three layer mask, covering the polyimide with a layer of silicon nitride which forms the second layer of the three layer mask, and covering the silicon nitride with a layer of photoresist which forms the first layer of the three layer mask.

8. The method of claim 6 wherein etching openings through the second layer includes etching the second layer with a reactive ion etch.

9. The method of claim 6 wherein etching openings through the third layer includes etching the third layer with a reactive ion etch which undercuts the second layer by a predetermined amount and forms walls in the opening of the third layer that are substantially perpendicular to the second layer.

10. The method of claim 6 wherein etching into the mesas includes etching the mesas with a wet chemical etch.

11. The method of claim 6 further including lifting off the three layer mask by immersing the substrate including structures on the substrate in a solvent.

12. A process that provides increased breakdown voltage in self-aligned transistors which comprises:

providing a substrate having a layer for forming source and drain areas of a transistor;

covering the substrate and the layer for forming source and drain areas with a first mask layer that forms a substantially planar first mask layer;

covering the first mask layer with a second mask layer;

applying a photoresist mask covering the second mask layer wherein the photoresist mask has openings defining etch areas;

etching openings in the second mask layer through the openings in the photoresist; and etching openings through the first mask layer wherein the etching undercuts the second mask layer by a predetermined amount and forms walls that are substantially perpendicular to the second mask layer thereby exposing portions of the layer for forming source and drain areas.

13. The method of claim 12 wherein covering the first mask layer includes covering the first mask layer with a material having an etch rate that is 10 times or more slower than an etch rate of the first mask layer.

14. The method of claim 12 further including removing at least the first mask layer by immersion in a solvent.

15. The method of claim 12 wherein etching openings through the first mask layer includes etching with a reactive ion etch.

16. The method of claim 12 further including etching an opening through a portion of the exposed layer for defining source and drain areas to form a source and a drain of the transistor wherein a portion of the substrate is exposed and wherein the etching is performed subsequent to forming the substantially perpendicular walls, then depositing gate material onto the substrate between the source and the drain.

* * * * *